United States Patent
Chen et al.

(10) Patent No.: US 12,008,242 B2
(45) Date of Patent: Jun. 11, 2024

(54) SIGNAL CALIBRATION METHOD, MEMORY STORAGE DEVICE, AND MEMORY CONTROL CIRCUIT UNIT

(71) Applicant: PHISON ELECTRONICS CORP., Miaoli (TW)

(72) Inventors: Yi-Chung Chen, Hsinchu County (TW); Ming-Chien Huang, Hsinchu (TW)

(73) Assignee: PHISON ELECTRONICS CORP., Miaoli (TW)

( * ) Notice: Subject to any disclaimer, the term of this patent is extended or adjusted under 35 U.S.C. 154(b) by 85 days.

(21) Appl. No.: 17/983,407

(22) Filed: Nov. 9, 2022

(65) Prior Publication Data
US 2024/0111430 A1 Apr. 4, 2024

(30) Foreign Application Priority Data
Sep. 30, 2022 (CN) .......................... 202211211298.1

(51) Int. Cl.
*G06F 3/06* (2006.01)
*G11C 11/4076* (2006.01)

(52) U.S. Cl.
CPC .......... *G06F 3/0614* (2013.01); *G06F 3/0629* (2013.01); *G06F 3/0673* (2013.01); *G11C 11/4076* (2013.01)

(58) Field of Classification Search
CPC .... G06F 3/0614; G06F 3/0629; G06F 3/0673; G11C 11/4076
See application file for complete search history.

(56) References Cited

U.S. PATENT DOCUMENTS

| | | | |
|---|---|---|---|
| 9,659,618 B1 * | 5/2017 | Huang | G11C 7/1066 |
| 2022/0101908 A1 * | 3/2022 | Ware | G06F 13/4243 |

OTHER PUBLICATIONS

"Office Action of Taiwan Counterpart Application", issued on Aug. 4, 2023, p. 1-p. 8.

* cited by examiner

*Primary Examiner* — Charles Rones
*Assistant Examiner* — Jonah C Krieger
(74) *Attorney, Agent, or Firm* — JCIPRNET

(57) ABSTRACT

A signal calibration method, a memory storage device, and a memory control circuit unit are provided. The signal calibration method includes: generating a clock signal and a data strobe signal according to an internal clock signal; respectively transmitting the clock signal and the data strobe signal to a target volatile memory module among multiple volatile memory modules through a first signal path and a second signal path; obtaining a shift value between the data strobe signal and the clock signal at the target volatile memory module; and storing an initial delay setting of the data strobe signal according to delay information of the data strobe signal in response to the shift value being greater than a threshold value.

21 Claims, 4 Drawing Sheets

SIGNAL CALIBRATION METHOD, MEMORY STORAGE DEVICE, AND MEMORY CONTROL CIRCUIT UNIT

CROSS-REFERENCE TO RELATED APPLICATION

This application claims the priority benefit of China application serial no. 202211211298.1, filed on Sep. 30, 2022. The entirety of the above-mentioned patent application is hereby incorporated by reference herein and made a part of this specification.

BACKGROUND

Technical Field

The disclosure relates to a signal calibration technology, and particularly relates to a signal calibration method, a memory storage device, and a memory control circuit unit.

Description of Related Art

Volatile memory such as dynamic random-access memory (DRAM) has advantages such as fast access speed and small volume, so the volatile memory is considerably suitable to be disposed in a portable electronic device to serve as a temporary storage medium of data. In addition, a memory controller may be used to control and access the volatile memory.

Traditionally, the clock signal and the data strobe signal (that is, the DQS signal) for communication and/or data transmission between the memory interface and the volatile memory may be calibrated through manners such as routing design and sending a preset bit string, so as to improve the accuracy of subsequent data readings. However, under the architecture of adopting multiple volatile memories, it is no longer possible to perform signal calibration simply through the wiring design. In addition, in high-speed signal transmission, if the boundary between the clock signal and the data strobe signal to be calibrated is very close, directly performing calibration may lead to issues such as timing disorder between the two locked signals (for example, a T(0)th pulse in the clock signal is locked to a T(1)th pulse in the data strobe signal), thereby affecting the subsequent data access performance to the volatile memory.

SUMMARY

The disclosure provides a signal calibration method, a memory storage device, and a memory control circuit unit, which can improve the above issues.

An exemplary embodiment of the disclosure provides a signal calibration method, which is used in a memory storage device. The memory storage device includes multiple volatile memory modules. The signal calibration method includes the following steps. A clock signal and a data strobe signal are generated according to an internal clock signal. The clock signal and the data strobe signal are respectively transmitted to a target volatile memory module among the volatile memory modules through a first signal path and a second signal path. A shift value between the data strobe signal and the clock signal at the target volatile memory module is obtained. An initial delay setting of the data strobe signal is stored according to delay information of the data strobe signal in response to the shift value being greater than a threshold value.

An exemplary embodiment of the disclosure further provides a memory storage device, which includes a connection interface unit, a rewritable non-volatile memory module, multiple volatile memory modules, and a memory control circuit unit. The connection interface unit is used to couple to a host system. The memory control circuit unit is coupled to the connection interface unit, the rewritable non-volatile memory module, and the volatile memory modules. The memory control circuit unit is used to execute the following. A clock signal and a data strobe signal are generated according to an internal clock signal. The clock signal and the data strobe signal are respectively transmitted to a target volatile memory module among the volatile memory modules through a first signal path and a second signal path. A shift value between the data strobe signal and the clock signal at the target volatile memory module is obtained. An initial delay setting of the data strobe signal is stored according to delay information of the data strobe signal in response to the shift value being greater than a threshold value.

An exemplary embodiment of the disclosure further provides a memory control circuit unit, which is used to control multiple volatile memory modules. The memory control circuit unit includes a memory controller, a memory interface circuit, and a control circuit. The memory interface circuit is coupled to the memory controller and the volatile memory modules. The control circuit is coupled to the memory interface circuit. The memory interface circuit is used to generate a clock signal and a data strobe signal according to an internal clock signal. The memory interface circuit is further used to respectively transmit the clock signal and the data strobe signal to a target volatile memory module among the volatile memory modules through a first signal path and a second signal path. The control circuit is used to obtain a shift value between the data strobe signal and the clock signal at the target volatile memory module. The control circuit is further used to store an initial delay setting of the data strobe signal according to delay information of the data strobe signal in response to the shift value being greater than a threshold value.

Based on the above, after the clock signal and the data strobe signal are generated according to the internal clock signal, the clock signal and the data strobe signal may be respectively transmitted to the target volatile memory module through the first signal path and the second signal path. After obtaining the shift value between the data strobe signal and the clock signal at the target volatile memory module, if the shift value is greater than the threshold value, the initial delay setting of the data strobe signal may be stored according to the delay information of the data strobe signal. In this way, the issue of timing disorder between the clock signal and the data strobe signal generated when executing signal calibration on the data strobe signal in the future can be effectively reduced.

DETAILED DESCRIPTION OF DISCLOSED EMBODIMENTS

Several exemplary embodiments are presented below to illustrate the disclosure, but the disclosure is not limited to the illustrated exemplary embodiments. Appropriate combinations are also permitted between the exemplary embodiments. The term "coupling" as used throughout the specification (including the claims) may refer to any direct or indirect connection means. For example, if a first device is described as being coupled to a second device, it should be interpreted that the first device may be directly connected to the second device or the first device may be indirectly connected to the second device through other devices or certain connection means. In addition, the term "signal" may refer to at least one current, voltage, charge, temperature, data, or any other one or more signals.

Figure 1:
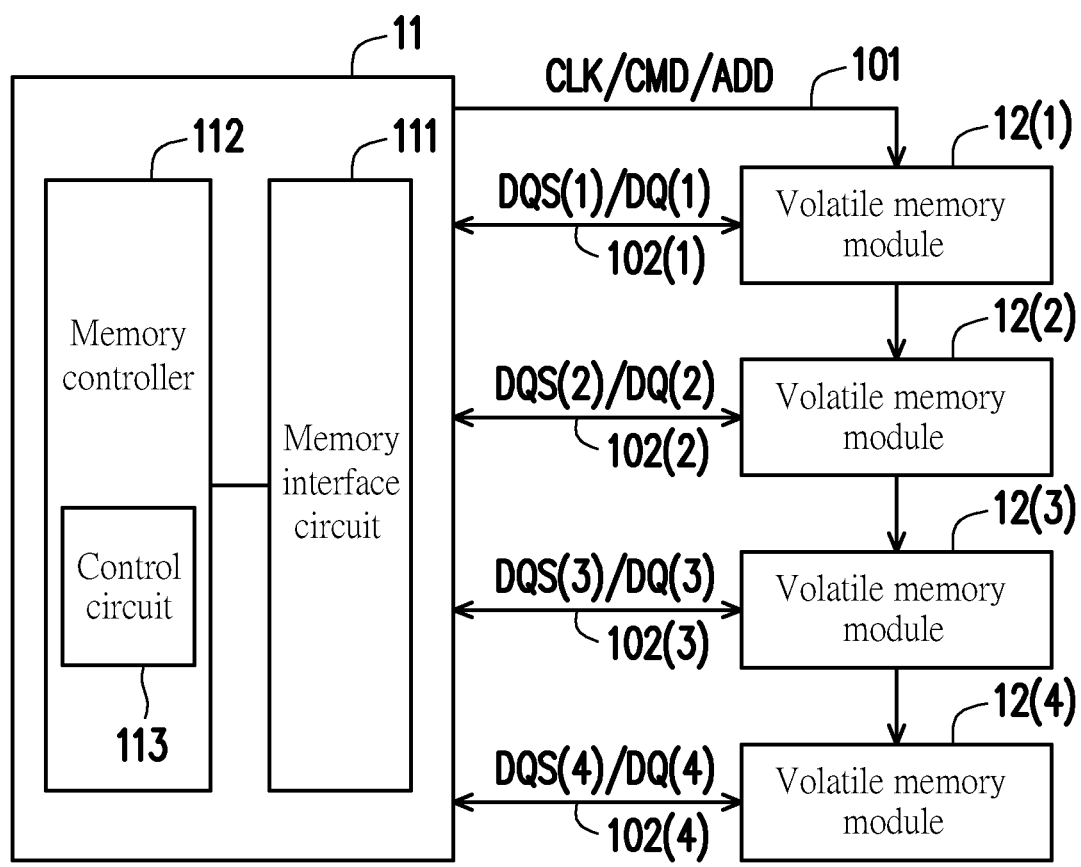
FIG. 1 is a schematic diagram of a memory storage device according to an exemplary embodiment of the disclosure.

FIG. 1 is a schematic diagram of a memory storage device according to an exemplary embodiment of the disclosure. Please refer to FIG. 1. A memory storage device 10 includes a memory control circuit unit 11 and volatile memory modules 12(1) to 12(4). It should be noted that the total number of the volatile memory modules 12(1) to 12(4) may be more or less, which is not limited in the disclosure.

The memory control circuit unit 11 may be used to control and access the volatile memory modules 12(1) to 12(4). For example, the memory control circuit unit 11 may include a central processing unit (CPU), other programmable general purpose or specific purpose microprocessors, digital signal processors (DSP), programmable controllers, application specific integrated circuits (ASIC), programmable logic devices (PLD), other similar devices, or a combination of these devices.

The volatile memory modules 12(1) to 12(4) may be respectively used to temporarily store data. For example, the volatile memory modules 12(1) to 12(4) may respectively include a double data rate 3 synchronous dynamic random-access memory (DDR 3 SDRAM), a double data rate 4 synchronous dynamic random-access memory (DDR 4 SDRAM), a double data rate 5 synchronous dynamic random-access memory (DDR 5 SDRAM), or other types of volatile memories. The memory control circuit unit 11 may store data into the volatile memory modules 12(1) to 12(4) or read data from the volatile memory modules 12(1) to 12(4).

The memory control circuit unit 11 may include a memory interface circuit 111 and a memory controller 112. The memory interface circuit 111 is coupled to the volatile memory modules 12(1) to 12(4). For example, the memory interface circuit 111 may communicate with the volatile memory modules 12(1) to 12(4) via the peripheral component interconnect (PCI) express standard or other types of connection interface standards.

The memory controller 112 is coupled to the memory interface circuit 111. The memory controller 112 may execute an access operation on the volatile memory modules 12(1) to 12(4) via the memory interface circuit 111. For example, the access operation may include a data read operation and a data write operation. The data read operation is used to read data from the volatile memory modules 12(1) to 12(4). The data write operation is used to write (that is, store) data into the volatile memory modules 12(1) to 12(4).

In an exemplary embodiment, the memory controller 112 is also referred to as a dynamic random-access memory (SRAM) controller. In addition, the memory controller 112 may be responsible for the whole or partial operation of the memory control circuit unit 11.

The memory interface circuit 111 may be coupled to the volatile memory modules 12(1) to 12(4) in a fly-by manner via a signal path (also referred to as a first signal path) 101. That is, signals transmitted on the signal path 101 share the channel to sequentially arrive at the volatile memory modules 12(1) to 12(4). In addition, the memory interface circuit 111 may be coupled in parallel to the volatile memory modules 12(1) to 12(4) via signal paths (also referred to as second signal paths) 102(1) to 102(4). That is, signals transmitted on the signal paths 102(1) to 102(4) may be transmitted between the memory control circuit unit 11 and the volatile memory modules 12(1) to 12(4) through independent channels. However, the setting manners of the signal paths 101 and 102(1) to 102(4) may also be adjusted according to practical requirements, which are not limited in the disclosure.

It should be noted that the signal path 101 is a unidirectional transmission path for signals. That is, the memory control circuit unit 11 may transmit a signal to the volatile memory modules 12(1) to 12(4) via the signal path 101. The signal paths 102(1) to 102(4) are all bidirectional transmission paths for signals. For example, when writing data to a volatile memory module 12(i), the memory control circuit unit 11 may transmit a signal to the volatile memory module 12(i) via a signal path 102(i). Alternatively, when reading data from the volatile memory module 12(i), the memory control circuit unit 11 may receive a signal from the volatile memory module 12(i) via the signal path 102(i).

The signal path 101 may be used to transmit a signal (also referred to as a clock signal) CLK to the volatile memory modules 12(1) to 12(4). The signal CLK may be used to synchronize a clock (also referred to as a system clock) of the memory control circuit unit 11 to the volatile memory modules 12(1) to 12(4). In addition, the signal path 101 may also be used to transmit a signal (also referred to as a command signal) CMD and a signal (also referred to as an address signal) ADD to the volatile memory modules 12(1) to 12(4). The signal CMD may be used to transmit information of an access command to be executed by the memory controller 112 to the volatile memory modules 12(1) to 12(4). The signal ADD may be used to transmit information of a memory address to be accessed by the memory controller 112 to the volatile memory modules 12(1) to 12(4). In addition, the signal path 101 may also be used to transmit other types of signals, which are not limited in the disclosure.

The signal paths 102(1) to 102(4) may be used to respectively transmit signals (also referred to as data strobe signals) DQS(1) to DQS(4) to the volatile memory modules 12(1) to 12(4). In addition, the signal paths 102(1) to 102(4) may also be used to respectively transmit signals (also referred to as data signals) DQ(1) to DQ(4) to the volatile memory modules 12(1) to 12(4). Signals DQS(i) and DQ(i) match each other. For example, the signal DQS(i) may be used to sample the signal DQ(i) to obtain data carried by the signal DQ(i).

Taking the signal path 102(i) as an example, when data is to be stored into the volatile memory module 12(i), the memory interface circuit 111 may transmit the signals CLK, CMD, and ADD to the volatile memory module 12(i) via the signal path 101 and transmit the signals DQS(i) and DQ(i) to the volatile memory module 12(i) via the signal path 102(*i*). According to the signals received via the signal paths 101 and 102, the volatile memory module 12(*i*) may execute the corresponding data write operation. The data write operation may be used to store the data to be stored by the memory controller 112 into the volatile memory module 12(*i*). In particular, in the data write operation, the volatile memory module 12(*i*) may use the signal DQS(i) to sample the signal DQ(i), so as to obtain the data to be stored by the memory controller 112.

On the other hand, when the data is to be read from the volatile memory module 12(*i*), the memory interface circuit 111 may transmit the signals CLK, CMD, and ADD to the volatile memory module 12(*i*) via the signal path 101. According to the signal received via the signal path 101, the volatile memory module 12(*i*) may execute the corresponding data read operation. The data read operation may be used to read the data to be read by the memory controller 112 from the volatile memory module 12(*i*). Then, the volatile memory module 12(*i*) may transmit the signals DQS(i) and DQ(i) to the memory interface circuit 111 via the signal path 102(*i*). The memory interface circuit 111 may use the signal DQS(i) to sample the signal DQ(i), so as to obtain the data to be read by the memory controller 112.

In an exemplary embodiment, the memory interface circuit 111 may generate the signal CLK and the signal DQS(i) according to an internal signal (also referred to as an internal clock signal). The memory interface circuit 111 may respectively transmit the signal CLK and the DQS(i) to a volatile memory module (also referred to as a target volatile memory module) 12(*i*) through the signal path 101 and the signal path 102(*i*).

In an exemplary embodiment, the memory control circuit unit 11 further includes a control circuit (also referred to as a shift control circuit) 113. The control circuit 113 may be coupled to the memory interface circuit 111. For example, the control circuit 113 may be disposed in the memory controller 112 (as shown in FIG. 1), disposed in the memory interface circuit 111, or independent of the memory interface circuit 111 and the memory controller 112. For example, the control circuit 113 may include a microprocessor, an embedded controller (EC), or other similar devices. In an exemplary embodiment, the control circuit 113 may also be implemented through software or firmware, which is not limited in the disclosure.

The control circuit 113 may obtain a shift value between the signal DQS(i) and the signal CLK at the volatile memory module 12(*i*). For example, the shift value may reflect a phase difference or a frequency difference between the signal DQS(i) and the signal CLK at the volatile memory module 12(*i*). It should be noted that how to obtain the shift value between the signal DQS(i) and the signal CLK at the volatile memory module 12(*i*) belongs to the conventional technology. For example, the signal DQS(i) and/or CLK may be sampled through a high frequency signal at the volatile memory module 12(*i*), so as to obtain respective transition point positions, etc. of the signals DQS(i) and CLK, which will not be repeated here.

The control circuit 113 may judge whether the shift value is greater than a threshold value. In response to the shift value being greater than the threshold value, the control circuit 113 may store (for example, update) an initial delay setting of the signal DQS(i) according to delay information of the signal DQS(i). For example, the delay information of the signal DQS(i) may reflect a current delay state of the signal DQS(i). Thereafter, the memory interface circuit 111 may regenerate the signal DQS(i) with the same delay state according to the initial delay setting. On the other hand, in response to the shift value not being greater than (for example, less than or equal to) the threshold value, the control circuit 113 may discard (that is, not store) the delay information of the signal DQS(i).

In an exemplary embodiment, after storing the initial delay setting, the memory interface circuit 111 may regenerate the signal DQS(i) according to the internal clock signal and the initial delay setting. It should be noted that the initial delay setting is stored according to the shift value between the signal DQS(i) and the signal CLK at the volatile memory module 12(*i*) being greater than the threshold value, so the shift value between the newly generated signal DQS(i) and the signal CLK at the volatile memory module 12(*i*) should also be theoretically greater than the threshold value. The memory interface circuit 111 may adjust a delay amount of the signal according to the regenerated signal DQS(i), so as to align the signal DQS(i) with the signal CLK at the volatile memory module 12(*i*). For example, the alignment may refer to a rising edge of the signal DQS(i) and a rising edge of the signal CLK being aligned with each other, a falling edge of the signal DQS(i) and a falling edge of the signal CLK being aligned with each other, or other alignment manners, depending on practical requirements. In an exemplary embodiment, the operation of the memory interface circuit 111 adjusting the delay amount of the signal according to the regenerated signal DQS(i), so as to align the signal DQS(i) with the signal CLK at the volatile memory module 12(*i*) may also be referred to as write leveling. It should be noted that the write leveling belongs to the conventional technology in the prior art, so there will be no repetition.

In an exemplary embodiment, using the initial delay setting to generate the signal DQS(i) executing the write leveling can ensure that the shift value between the signal DQS(i) and the signal CLK at the volatile memory module 12(*i*) during an initial stage of the write leveling is greater than (or not less than) the threshold value. In this way, after executing the write leveling to lock the signals CLK and DQS(i), the probability of timing disorder between the locked signals CLK and DQS(i) (for example, a T(0)th pulse in the signal CLK is locked to a T(1)th pulse in the signal DQS(i)) can be reduced.

In an exemplary embodiment, the memory interface circuit 111 may detect a boot signal. For example, the boot signal may be automatically generated every time the memory storage device 10 is booted or powered on. The memory interface circuit 111 may generate the signal DQS (i) according to the internal clock signal and the initial delay setting in response to the boot signal. Then, the memory interface circuit 111 may execute the write leveling on the volatile memory module 12(*i*) based on the signal DQS(i) generated according to the initial delay setting, so that the signal DQS(i) is aligned with the signal CLK at the volatile memory module 12(*i*).

In an exemplary embodiment, the control circuit 113 may obtain multiple shift values (also referred to as candidate shift values) between the signal DQS(i) and the signal CLK at the volatile memory module 12(*i*). Each candidate shift value may be different due to being affected by noise or jitter in the channel at different time points. The memory controller 112 may perform a statistical computation on the candidate shift values to obtain the shift values to be finally used to compare with the threshold value. In this way, it is possible to obtain statistical data of the shift value that is more objective and has a higher tolerance for errors for the currently adopted signal DQS(i), thereby determining whether to store the initial delay setting according to the delay information of the signal DQS(i) according to the statistical data. The relevant details have been described in detail above and will not be repeated here.

Figure 2:
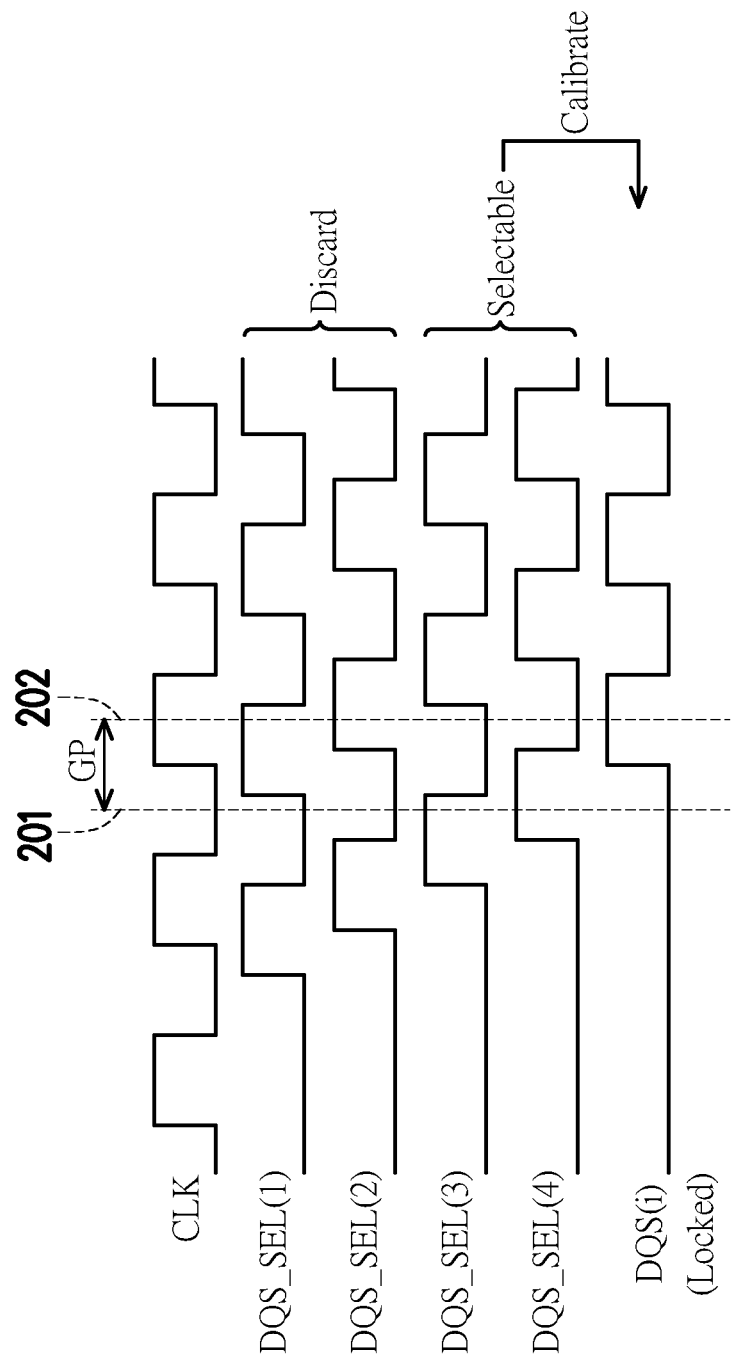
FIG. 2 is a schematic diagram of signal timing of a clock signal and a data strobe signal at a volatile memory module according to an exemplary embodiment of the disclosure.

FIG. 2 is a schematic diagram of signal timing of a clock signal and a data strobe signal at a volatile memory module according to an exemplary embodiment of the disclosure. Please refer to FIG. 1 and FIG. 2. It is assumed that the signal DQS(i) includes signals DQS_SEL(1) to DQS_SEL(4). The signals CLK and DQS_SEL(1) to DQS_SEL(4) may all be generated according to the internal clock signal. In particular, phases of the signals DQS_SEL(1) to DQS_SEL(4) are different. In addition, the total number of the signals DQS_SEL(1) to DQS_SEL(4) may be more or less, which is not limited in the disclosure.

In an exemplary embodiment, the memory interface circuit 111 may increase a delay amount of one of the signals DQS_SEL(1) to DQS_SEL(4) by m delay time units to generate another one of the signals DQS_SEL(1) to DQS_SEL(4). The delay time unit may correspond to 1/n of one clock period of the signal DQS(i), where m and n are both positive integers. For example, if n is 4, the memory interface circuit 111 may increase the delay amount of the signal DQS_SEL(1) by 1 to 3 delay time units to respectively generate the signal DQS_SEL(2) to DQS_SEL(4). The phases of the signals DQS_SEL(1) to DQS_SEL(4) may differ by 90 degrees (corresponding to ¼ clock cycle) or other degrees.

In an exemplary embodiment, the memory interface circuit 111 may transmit one of the signals DQS_SEL(1) to DQS_SEL(4) to the volatile memory module 12(i). The memory controller 112 may judge whether a shift value between one of the signals DQS_SEL(1) to DQS_SEL(4) and the signal CLK at the volatile memory module 12(i) is greater than a threshold value. In response to the shift value (also referred to as a first shift value) between one of the signals DQS_SEL(1) to DQS_SEL(4) (for example, a signal DQS_SEL(j)) and the signal CLK at the volatile memory module 12(i) being not greater than the threshold value, the memory controller 112 may discard (that is, not store) delay information of the signal DQS_SEL(j). For example, the delay information of the signal DQS_SEL(j) may reflect a delay state of the signal DQS_SEL(j). Alternatively, in response to the shift value (also referred to as a second shift value) between one of the signals DQS_SEL(1) to DQS_SEL(4) (for example, a signal DQS_SEL(k)) and the signal CLK at the volatile memory module 12(i) being greater than the threshold value, the memory controller 112 may store delay information of the signal DQS_SEL(k) as the initial delay setting of the signal DQS(i). For example, the delay information of the signal DQS_SEL(k) may reflect a delay state of the signal DQS_SEL(k). k is different from j.

Taking FIG. 2 as an example, the signal DQS_SEL(j) may include the signals DQS_SEL(1) and DQS_SEL(2). For example, the rising edges of the signals DQS_SEL(1) and DQS_SEL(2) are both located in a filtering region GP. For example, boundaries 201 and 202 at two ends of the filtering region GP are defined by the rising edge of the signal CLK being the center. For example, the boundaries 201 and 202 at two ends of the filtering region GP may be obtained by respectively extending the rising edge of the signal CLK to the left and right by one time unit. It should be noted that the width of the filtering region GP (that is, the distance between the boundaries 201 and 202) may also be adjusted according to practical requirements, which is not limited in the disclosure.

In an exemplary embodiment, the rising edge of the signal DQS_SEL(j) is located in the filtering region GP, which means that the boundary of the signal DQS_SEL(j) is relatively close to the boundary of the signal CLK. Therefore, if the signal DQS_SEL(j) is subsequently used as the signal DQS(i) to execute the write leveling (that is, phase calibration) with the signal CLK, timing disorder may easily occur between the locked signals CLK and DQS(i). In an exemplary embodiment, excluding the signal DQS_SEL(j) can reduce the probability of timing disorder between the locked signals CLK and DQS(i).

In an exemplary embodiment, the signal DQS_SEL(k) may include the signals DQS_SEL(3) and DQS_SEL(4). For example, the rising edges of the signals DQS_SEL(3) and DQS_SEL(4) are both not located in the filtering region GP.

In an exemplary embodiment, the rising edge of the signal DQS_SEL(k) is not located in the filtering region GP, which means that the boundary of the signal DQS_SEL(k) is relatively far from the boundary of the signal CLK. Therefore, if the signal DQS_SEL(k) is subsequently used as the signal DQS(i) to execute the write leveling with signal CLK, the probability of timing disorder between the locked signals CLK and DQS(i) can be reduced. In an exemplary embodiment, selecting the signal DQS_SEL(k) as the signal DQS(i) to execute the write leveling can reduce the probability of timing disorder between the locked signals CLK and DQS(i).

In an exemplary embodiment, the memory interface circuit 111 may first transmit the signal DQS_SEL(j) to the volatile memory module 12(i). After judging that the first shift value is not greater than the threshold value, the memory interface circuit 111 may generate the signal DQS_SEL(k) and transmit the signal DQS_SEL(k) to the volatile memory module 12(i), and so on until the suitable signal DQS_SEL(k) is found.

Figure 3:
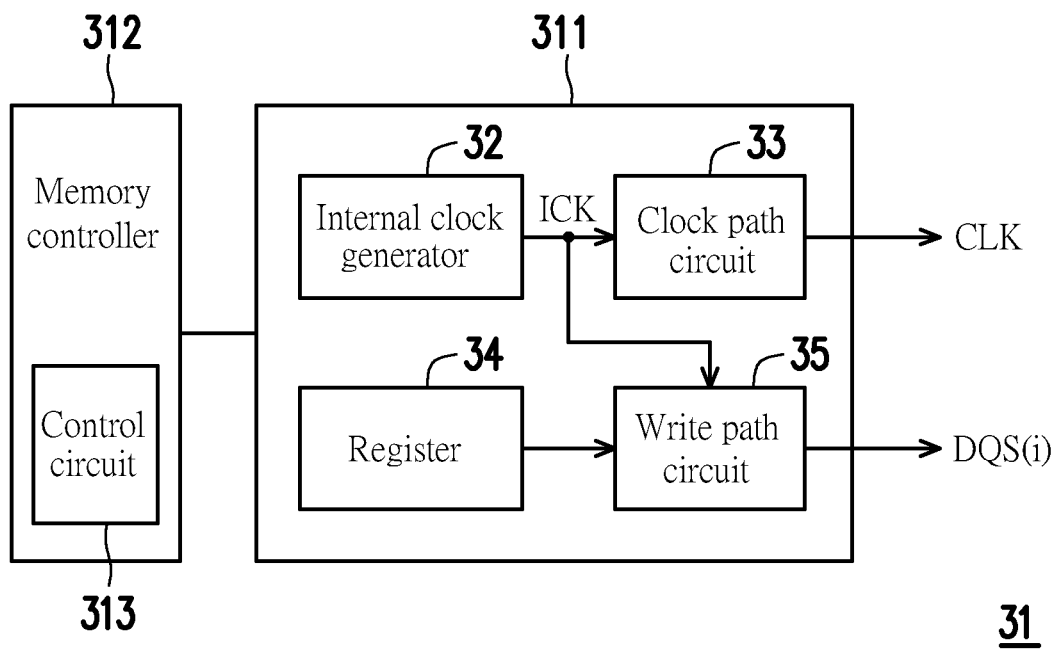
FIG. 3 is a schematic diagram of a memory control circuit unit according to an exemplary embodiment of the disclosure.

FIG. 3 is a schematic diagram of a memory control circuit unit according to an exemplary embodiment of the disclosure. Please refer to FIG. 3. A memory control circuit unit 31 may be the same as or similar to the memory control circuit unit 11 of FIG. 1. The memory control circuit unit 31 may include a memory interface circuit 311, a memory controller 312, and a control circuit 313. The memory interface circuit 311, the memory controller 312, and the control circuit 313 may be respectively the same as or similar to the memory interface circuit 111, the memory controller 112, and the control circuit 113 of FIG. 1.

The memory interface circuit 311 may include an internal clock generator 32, a clock path circuit 33, a register 34, and a write path circuit 35. The internal clock generator 32 is coupled to the clock path circuit 33 and the write path circuit 35. The register 34 is coupled to the write path circuit 35. In addition, the memory interface circuit 311 may also have various electronic circuit elements such as a read path circuit and a multiplexer, which are not limited in the disclosure.

The internal clock generator 32 may be used to generate a signal (that is, an internal clock signal) ICK. The clock path circuit 33 may generate the signal CLK according to the signal ICK. The signal CLK may be transmitted to the volatile memory module 12(i). The register 34 may be used to store the initial delay setting of the signal DQS(i). The write path circuit 35 may generate the signal DQS(i) with a specific delay state according to the signal ICK and the initial delay setting in the register 34. Then, the signal DQS(i) may be transmitted to the volatile memory module 12(i). Thereafter, the write leveling at the volatile memory module 12(i) may be executed according to the signal DQS(i). The relevant details have been described in detail above and will not be repeated here.

Figure 4:
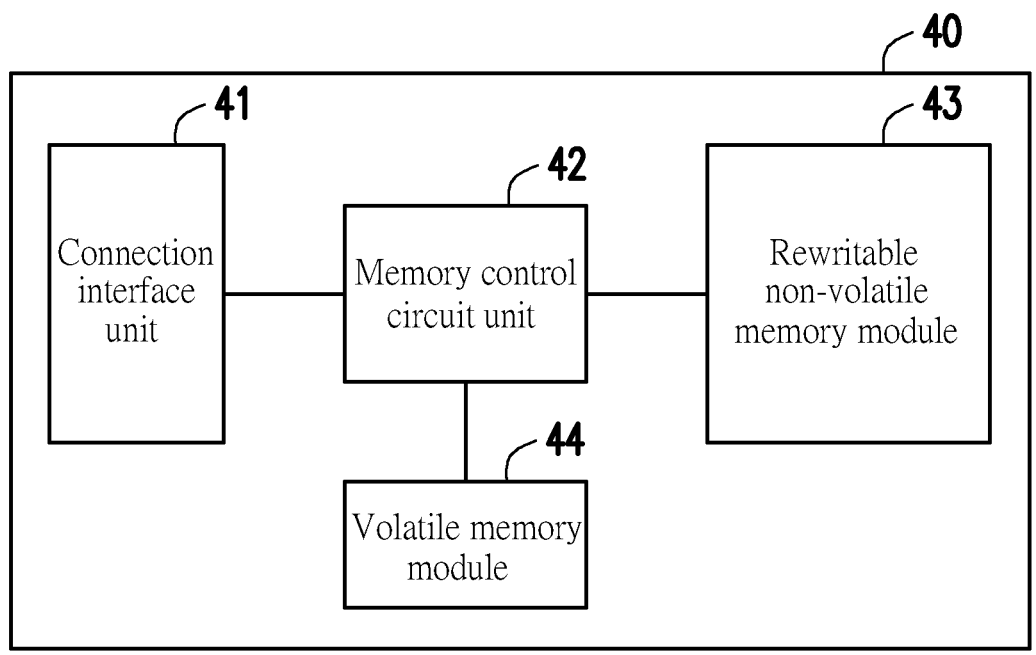
FIG. 4 is a schematic diagram of a memory storage device according to an exemplary embodiment of the disclosure.

FIG. 4 is a schematic diagram of a memory storage device according to an exemplary embodiment of the disclosure. Please refer to FIG. 4. A memory storage device 40 includes a connection interface unit 41, a memory control circuit unit 42, a rewritable non-volatile memory module 43, and a volatile memory module 44.

The connection interface unit 41 is used to couple the memory storage device 40 to a host system. The memory storage device 40 may communicate with the host system via the connection interface unit 41. In an exemplary embodiment, the connection interface unit 41 is compliant with the PCI express standard. In an exemplary embodiment, the connection interface unit 41 may also conform to the serial advanced technology attachment (SATA) standard, the parallel advanced technology attachment (PATA) standard, the Institute of Electrical and Electronic Engineers (IEEE) 1394 standard, the universal serial bus (USB) standard, the SD interface standard, the ultra high speed-I (UHS-I) interface standard, the ultra high speed-II (UHS-II) interface standard, the memory stick (MS) interface standard, the MCP interface standard, the MMC interface standard, the eMMC interface standard, the universal flash storage (UFS) interface standard, the eMCP interface standard, the CF interface standard, the integrated device electronics (IDE) standard, or other suitable standards. The connection interface unit 41 and the memory control circuit unit 42 may be packaged in one chip, or the connection interface unit 41 may be arranged outside a chip including the memory control circuit unit 42.

The memory control circuit unit 42 is coupled to the connection interface unit 41, the rewritable non-volatile memory module 43, and the volatile memory module 44. The memory control circuit unit 42 is used to execute multiple logic gates or control commands implemented in the form of hardware or in the form of firmware and perform operations such as data writing, reading, and erasing in the rewritable non-volatile memory module 43 according to a command of the host system. In addition, the memory control circuit unit 42 may include the memory control circuit unit 11 of FIG. 1 or the memory control circuit unit 31 of FIG. 3.

The rewritable non-volatile memory module 43 is used to store data written by the host system. The rewritable non-volatile memory module 43 may include a single level cell (SLC) NAND type flash memory module (that is, a flash memory module that may store 1 bit in a memory cell), a multi level cell (MLC) NAND type flash memory module (that is, a flash memory module that may store 2 bits in a memory cell), a triple level cell (TLC) NAND type flash memory module (that is, a flash memory module that may store 3 bits in a memory cell), a quad level cell (QLC) NAND type flash memory module (that is, a flash memory module that may store 4 bits in a memory cell), other flash memory modules, or other memory modules with the same characteristics.

Each memory cell in the rewritable non-volatile memory module 43 stores one or more bits with changes in voltage (hereinafter also referred to as a threshold voltage). Specifically, there is a charge trapping layer between a control gate and a channel of each memory cell. Through applying a write voltage to the control gate, the number of electrons in the charge trapping layer may be changed, thereby changing the threshold voltage of the memory cell. The operation of changing the threshold voltage of the memory cell is also referred to as "writing data to the memory cell" or "programming the memory cell". As the threshold voltage changes, each memory cell in the rewritable non-volatile memory module 43 has multiple storage states. Through applying a read voltage, it is possible to judge which storage state a memory cell belongs to, so as to obtain one or more bits stored in the memory cell.

In an exemplary embodiment, the memory cells of the rewritable non-volatile memory module 43 may constitute multiple physical programming units, and the physical programming units may constitute multiple physical erasing units. Specifically, the memory cells on the same word line may form one or more physical programming units. If each memory cell may store more than 2 bits, the physical programming units on the same word line may be at least classified into a lower physical programming unit and an upper physical programming unit. For example, a least significant bit (LSB) of a memory cell belongs to the lower physical programming unit, and a most significant bit (MSB) of a memory cell belongs to the upper physical programming unit. Generally speaking, in the MLC NAND type flash memory, the write speed of the lower physical programming unit is greater than the write speed of the upper physical programming unit and/or the reliability of the lower physical programming unit is higher than the reliability of the upper physical programming unit.

In an exemplary embodiment, the physical programming unit is the smallest unit of programming. That is, the physical programming unit is the smallest unit of writing data. For example, the physical programming unit may be a physical page or a physical sector. If the physical programming unit is a physical page, the physical programming units may include a data bit area and a redundancy bit area. The data bit area includes multiple physical sectors for storing user data, and the redundancy bit area is used to store system data (for example, management data such as an error correcting code). In an exemplary embodiment, the data bit area includes 32 physical sectors, and the size of one physical sector is 512 bytes (B). However, in other exemplary embodiments, the data bit area may also include 8, 16, more, or less physical sectors, and the size of each physical sector may also be greater or smaller. On the other hand, the physical erasing unit is the smallest unit of erasure. That is, each physical erasing unit includes the smallest number of memory cells to be erased together. For example, the physical erasing unit is a physical block.

The volatile memory module 44 is used for volatile storage of data. For example, the volatile memory module 44 may include the volatile memory modules 12(1) to 12(4) of FIG. 1. In addition, the total number of the volatile memory module 44 may be more or less.

Figure 5:
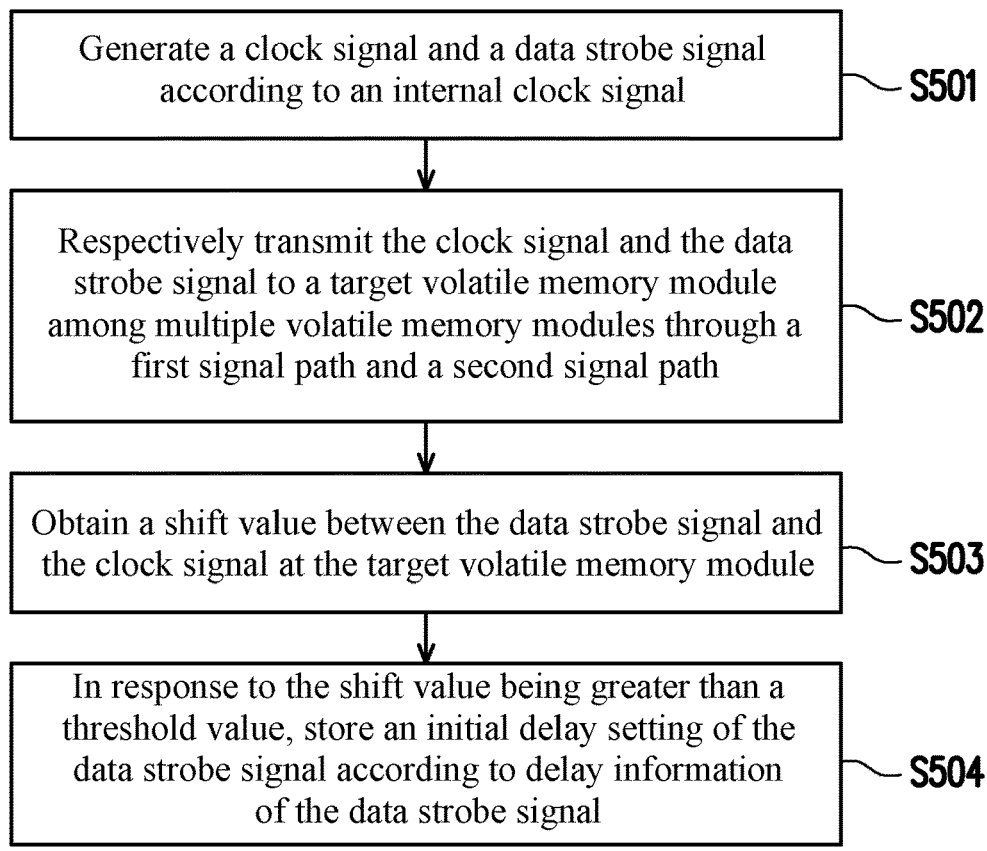
FIG. 5 is a flowchart of a signal calibration method according to an exemplary embodiment of the disclosure.

FIG. 5 is a flowchart of a signal calibration method according to an exemplary embodiment of the disclosure. Please refer to FIG. 5. In Step S501, a clock signal and a data strobe signal are generated according to an internal clock signal. In Step S502, the clock signal and the data strobe signal are respectively transmitted to a target volatile memory module among multiple volatile memory modules through a first signal path and a second signal path. In Step S503, a shift value between the data strobe signal and the clock signal at the target volatile memory module is obtained. In Step S504, in response to the shift value being greater than a threshold value, an initial delay setting of the data strobe signal is stored according to delay information of the data strobe signal.

Figure 6:
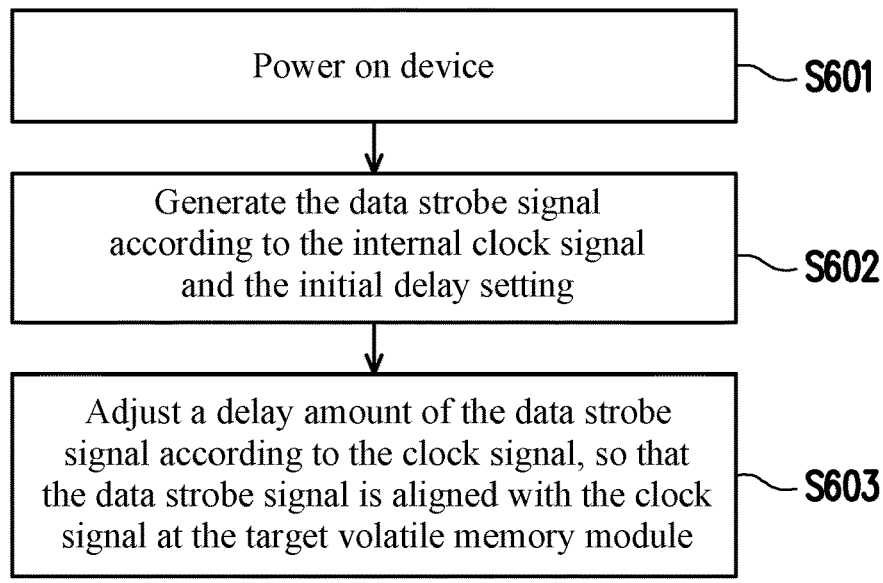
FIG. 6 is a flowchart of a signal calibration method according to an exemplary embodiment of the disclosure.

FIG. 6 is a flowchart of a signal calibration method according to an exemplary embodiment of the disclosure. Please refer to FIG. 6. In Step S601, a memory storage device is powered on (for example, booted or awakened). In Step S602, the data strobe signal is generated according to the internal clock signal and the initial delay setting. In Step S603, a delay amount of the data strobe signal is adjusted according to the clock signal, so that the data strobe signal is aligned with the clock signal at the target volatile memory module.

Each step in FIG. 5 and FIG. 6 has been described in detail as above and will not be repeated here. It is worth noting that each step in FIG. 5 and FIG. 6 may be implemented as multiple program codes or circuits, which is not limited in the disclosure. In addition, the methods of FIG. 5 and FIG. 6 may be used in conjunction with the above exemplary embodiments and may also be used alone, which is not limited in the disclosure.

In summary, the signal calibration method, the memory storage device, and the memory control circuit unit provided by the embodiments of the disclosure may store the initial delay setting of the data strobe signal for different volatile memory modules. In particular, the shift value between the data strobe signal and the clock signal at the volatile memory generated according to the initial delay setting is greater than the threshold value. Therefore, after executing the write leveling on the data strobe signal, the probability of timing disorder between the locked clock signal and data strobe signal can be reduced.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A signal calibration method for a memory storage device, the memory storage device comprising a plurality of volatile memory modules, the signal calibration method comprising:
    generating a clock signal and a data strobe signal according to an internal clock signal;
    respectively transmitting the clock signal and the data strobe signal to a target volatile memory module among the volatile memory modules through a first signal path and a second signal path;
    obtaining a shift value between the data strobe signal and the clock signal at the target volatile memory module; and
    storing an initial delay setting of the data strobe signal according to delay information of the data strobe signal in response to the shift value being greater than a threshold value.

2. The signal calibration method according to claim 1, wherein the data strobe signal comprises a first data strobe signal and a second data strobe signal, a first shift value between the first data strobe signal and the clock signal at the target volatile memory module is not greater than the threshold value, a second shift value between the second data strobe signal and the clock signal at the target volatile memory module is greater than the threshold value, and the step of storing the initial delay setting of the data strobe signal according to the delay information of the data strobe signal in response to the shift value being greater than the threshold value comprises:
    storing the initial delay setting of the data strobe signal according to delay information of the second data strobe signal in response to the second shift value being greater than the threshold value.

3. The signal calibration method according to claim 2, further comprising:
    discarding delay information of the first data strobe signal in response to the first shift value not being greater than the threshold value.

4. The signal calibration method according to claim 2, further comprising:
    increasing a delay amount of the first data strobe signal by m delay time units to generate the second data strobe signal, wherein the delay time unit corresponds to 1/n of one clock cycle of the data strobe signal, where m and n are both positive integers.

5. The signal calibration method according to claim 1, further comprising:
    generating the data strobe signal according to the internal clock signal and the initial delay setting after storing the initial delay setting; and
    adjusting a delay amount of the data strobe signal according to the clock signal to align the data strobe signal with the clock signal at the target volatile memory module.

6. The signal calibration method according to claim 5, wherein the step of generating the data strobe signal according to the internal clock signal and the initial delay setting comprises:
    detecting a boot signal; and
    generating the data strobe signal according to the internal clock signal and the initial delay setting in response to the boot signal.

7. The signal calibration method according to claim 1, wherein the step of obtaining the shift value between the data strobe signal and the clock signal at the target volatile memory module comprises:
    obtaining a plurality of candidate shift values between the data strobe signal and the clock signal at the target volatile memory module; and
    performing a statistical computation on the candidate shift values to obtain the shift value.

8. A memory storage device, comprising:
    a connection interface unit, used to couple to a host system;
    a rewritable non-volatile memory module;
    a plurality of volatile memory modules; and
    a memory control circuit unit, coupled to the connection interface unit, the rewritable non-volatile memory module, and the volatile memory modules,
    wherein the memory control circuit unit is used to:
        generate a clock signal and a data strobe signal according to an internal clock signal;
        respectively transmit the clock signal and the data strobe signal to a target volatile memory module among the volatile memory modules through a first signal path and a second signal path;
        obtain a shift value between the data strobe signal and the clock signal at the target volatile memory module; and
        store an initial delay setting of the data strobe signal according to delay information of the data strobe signal in response to the shift value being greater than a threshold value.

9. The memory storage device according to claim 8, wherein the data strobe signal comprises a first data strobe signal and a second data strobe signal, a first shift value between the first data strobe signal and the clock signal at the target volatile memory module is not greater than the threshold value, a second shift value between the second data strobe signal and the clock signal at the target volatile memory module is greater than the threshold value, and the operation of the memory control circuit unit storing the initial delay setting of the data strobe signal according to the delay information of the data strobe signal in response to the shift value being greater than the threshold value comprises:

storing the initial delay setting of the data strobe signal according to delay information of the second data strobe signal in response to the second shift value being greater than the threshold value.

10. The memory storage device according to claim 9, wherein the memory control circuit unit is further used to:

discard delay information of the first data strobe signal in response to the first shift value not being greater than the threshold value.

11. The memory storage device according to claim 9, wherein the memory control circuit unit is further used to:

increase a delay amount of the first data strobe signal by m delay time units to generate the second data strobe signal, wherein the delay time unit corresponds to 1/n of one clock cycle of the data strobe signal, where m and n are both positive integers.

12. The memory storage device according to claim 8, wherein the memory control circuit unit is further used to:

generate the data strobe signal according to the internal clock signal and the initial delay setting after storing the initial delay setting; and adjust a delay amount of the data strobe signal according to the clock signal to align the data strobe signal with the clock signal at the target volatile memory module.

13. The memory storage device according to claim 12, wherein the operation of the memory control circuit unit generating the data strobe signal according to the internal clock signal and the initial delay setting comprises:

detecting a boot signal; and generating the data strobe signal according to the internal clock signal and the initial delay setting in response to the boot signal.

14. The memory storage device according to claim 8, wherein the operation of the memory control circuit unit obtaining the shift value between the data strobe signal and the clock signal at the target volatile memory module comprises:

obtaining a plurality of candidate shift values between the data strobe signal and the clock signal at the target volatile memory module; and performing a statistical computation on the candidate shift values to obtain the shift value.

15. A memory control circuit unit for controlling a plurality of volatile memory modules, the memory control circuit unit comprising:

a memory controller;

a memory interface circuit, coupled to the memory controller and the volatile memory modules; and a control circuit, coupled to the memory interface circuit, wherein the memory interface circuit is used to generate a clock signal and a data strobe signal according to an internal clock signal, the memory interface circuit is further used to respectively transmit the clock signal and the data strobe signal to a target volatile memory module among the volatile memory modules through a first signal path and a second signal path, the control circuit is used to obtain a shift value between the data strobe signal and the clock signal at the target volatile memory module, and the control circuit is further used to store an initial delay setting of the data strobe signal according to delay information of the data strobe signal in response to the shift value being greater than a threshold value.

16. The memory control circuit unit according to claim 15, wherein the data strobe signal comprises a first data strobe signal and a second data strobe signal, a first shift value between the first data strobe signal and the clock signal at the target volatile memory module is not greater than the threshold value, a second shift value between the second data strobe signal and the clock signal at the target volatile memory module is greater than the threshold value, and the operation of the control circuit storing the initial delay setting of the data strobe signal according to the delay information of the data strobe signal in response to the shift value being greater than the threshold value comprises:

storing the initial delay setting of the data strobe signal according to delay information of the second data strobe signal in response to the second shift value being greater than the threshold value.

17. The memory control circuit unit according to claim 16, wherein the control circuit is further used to:

discard delay information of the first data strobe signal in response to the first shift value not being greater than the threshold value.

18. The memory control circuit unit according to claim 16, wherein the memory interface circuit is further used to:

increase a delay amount of the first data strobe signal by m delay time units to generate the second data strobe signal, wherein the delay time unit corresponds to 1/n of one clock cycle of the data strobe signal, where m and n are both positive integers.

19. The memory control circuit unit according to claim 15, wherein the memory interface circuit is further used to:

generate the data strobe signal according to the internal clock signal and the initial delay setting after storing the initial delay setting; and adjust a delay amount of the data strobe signal according to the clock signal to align the data strobe signal with the clock signal at the target volatile memory module.

20. The memory control circuit unit according to claim 19, wherein the operation of the memory interface circuit generating the data strobe signal according to the internal clock signal and the initial delay setting comprises:

detecting a boot signal; and generating the data strobe signal according to the internal clock signal and the initial delay setting in response to the boot signal.

21. The memory control circuit unit according to claim 15, wherein the operation of the control circuit obtaining the shift value between the data strobe signal and the clock signal at the target volatile memory module comprises:

obtaining a plurality of candidate shift values between the data strobe signal and the clock signal at the target volatile memory module; and performing a statistical computation on the candidate shift values to obtain the shift value.

* * * * *